(12) United States Patent
Donakowski et al.

(10) Patent No.: US 12,704,559 B2
(45) Date of Patent: Aug. 11, 2026

(54) DEPTH OF DISCHARGE DETERMINATION OF ALKALINE BATTERIES

(71) Applicant: Medtronic, Inc., Minneapolis, MN (US)

(72) Inventors: Martin D. Donakowski, Minneapolis, MN (US); Kaimin Chen, Shoreview, MN (US)

(73) Assignee: Medtronic, Inc., Minneapolis, MN (US)

( * ) Notice: Subject to any disclaimer, the term of this patent is extended or adjusted under 35 U.S.C. 154(b) by 198 days.

(21) Appl. No.: 18/095,287

(22) Filed: Jan. 10, 2023

(65) Prior Publication Data

US 2023/0258732 A1 Aug. 17, 2023

Related U.S. Application Data

(60) Provisional application No. 63/310,316, filed on Feb. 15, 2022.

(51) Int. Cl.
*G01R 31/392* (2019.01)
*G01R 31/36* (2020.01)
*G01R 31/378* (2019.01)
*G01R 31/387* (2019.01)
*G01R 31/389* (2019.01)

(52) U.S. Cl.
CPC ....... *G01R 31/392* (2019.01); *G01R 31/3647* (2019.01); *G01R 31/378* (2019.01); *G01R 31/387* (2019.01); *G01R 31/389* (2019.01)

(58) Field of Classification Search
CPC .. G01R 31/392; G01R 31/387; G01R 31/389; G01R 31/3647; G01R 31/378
See application file for complete search history.

(56) References Cited

U.S. PATENT DOCUMENTS 4,743,855 A 5/1988 Randin et al.
9,203,247 B2 * 12/2015 Nakashima ........... H02J 7/0019
9,419,289 B2 8/2016 Sholklapper et al.
9,678,165 B2 * 6/2017 Joe ........................ H01M 10/48
(Continued)

FOREIGN PATENT DOCUMENTS

CN 112924879 A * 6/2021 ......... G01R 31/3648

OTHER PUBLICATIONS

Technical Report AFAPL-TR-75-83, State of Charge Determination for Aerospace Batteries, Radian Corporation, Austin, Texas, Oct. 1975.

(Continued)

*Primary Examiner* — Walter L Lindsay, Jr.
*Assistant Examiner* — Milton Gonzalez
(74) *Attorney, Agent, or Firm* — Mueting Raasch Group

(57) ABSTRACT

A method for determining a depth of discharge of an electrochemical cell includes (i)) providing one or more alkaline electrochemical cells comprising $Ag_2O$—Zn; (ii) applying a varying voltage potential to the one or more alkaline electrochemical cells, (iii) measuring an output current response of the one or more alkaline electrochemical cells, the output current response comprising a phase response as a function of frequency; and (iv) determining a depth of discharge of the one or more alkaline electrochemical cells based on a linear relationship of the depth of discharge with the phase response.

13 Claims, 9 Drawing Sheets

(56) References Cited

U.S. PATENT DOCUMENTS

| | | | |
|---|---|---|---|
| 10,330,732 | B2 | 6/2019 | Roumi et al. |
| 2014/0218042 | A1 | 8/2014 | Koba et al. |

OTHER PUBLICATIONS

Schweiger et al., "Comparison of Several Methods for Determining the Internal Resistance of Lithium Ion Cells," Sensors 2010, 10, 5604-5625.

Technical Report 31, Electrochemical Impedance Spectroscopy for Battery Research and Development, Cortech Corporation, California, 1996.

Suresh et al., "Analysis of AC Impedance of AgO—Zn Cells: Effects of State-of-Charge, Temperature and Cycle-Life," Science Direct, Electrochimica Acta 50 (2005) 3262-3272.

Randin, Jean-Paul, "Determination of State-of-Discharge of Zinc-Silever Oxide Button Cells. III. In Situ Impedance Measurements of Each Electrode," Journal of Applied Electrochemistry 15 (1985) 591-601.

Le et al., "Review-Status of Zinc-Silver Battery," Journal of the Electrochemical Society, 166 (13) A2980-2989 (2019).

International Search Report and Written Opinion for PCT/IB2023/050843 mailed May 24, 2023 (11 pages).

* cited by examiner 200
202
000-000
056-010
057-010
058-015
059-015
060-025
061-025
062-050
063-050
-Phase (degrees)
15
10
5
Frequency (Hz)
0.1
1
10
100
1000
10000
100000

442
450
Provide one or more alkaline electrochemical cells
460
Apply one or more current pulses to the one or more alkaline electrochemical cells
470
Measure resistance values of the one or more alkaline electrochemical cells
480
Is DoD ≤ threshold?
No
Yes
492
494
Not enough energy for application
Enough energy for application 510
Pulse
0.5 mAmp
2 mAmp
8 mAmp
Voltage after Pulse (Volts)
1.6
1.5
1.4
1.3
1.2
0
20
40
60
80
100
DoD

DEPTH OF DISCHARGE DETERMINATION OF ALKALINE BATTERIES

RELATED PATENT APPLICATION

This application claims the benefit of U.S. Provisional Patent Application Ser. No. 63/310,316, filed on Feb. 15, 2022, which is incorporated by reference herein in its entirety.

FIELD

The present disclosure is generally related to batteries. More specifically, the present technology relates to depth of discharge determination for alkaline batteries.

BACKGROUND

Electrochemical cells can be used in a variety of medical equipment such as implantable medical devices, ventilators, surgical staplers, medical monitoring equipment, etc. Some electrochemical cells can be recharged to allow repeated use of the electrochemical cells and extend the useful life of such electrochemical cells

SUMMARY

The present disclosure describes, among other things, methods for determining depth of discharge of electrochemical cells and systems comprising electrochemical cells and configured to determine depth of discharge of the electrochemical cells. The electrochemical cells may be alkaline electrochemical cells. The alkaline electrochemical cells may comprise $Ag_2O$—Zn. Systems that comprise the electrochemical cells may include medical equipment.

In an aspect, the present disclosure describes a method comprising: (i) providing one or more alkaline electrochemical cells comprising $Ag_2O$—Zn; (ii) applying a varying voltage potential to the one or more alkaline electrochemical cells, (iii) measuring an output current response of the one or more alkaline electrochemical cells, the output current response comprising a phase response as a function of frequency; and (iv) determining a depth of discharge of the one or more alkaline electrochemical cells based on a linear relationship of the depth of discharge with the phase response.

Measuring the output current response of the one or more alkaline electrochemical cells comprises measuring the phase response of the one or more alkaline electrochemical cells using impedance spectroscopy.

The method may further comprise determining whether the depth of discharge is less than or equal to a predetermined threshold. If it is determined that the depth of discharge is not less than or equal to the predetermined threshold, the one or more electrochemical cells may be determined to be defective. The predetermined threshold may be 50%.

The method may further comprise determining whether the one or more electrochemical cells have enough power for a predetermined application based on the depth of discharge.

The phase angle may decrease as a function of depth of discharge at frequencies in a predetermined range. The predetermined range may be about 0.001 Hz to about 10 Hz.

The method may further comprise determining the linear relationship based on one or more parameters of the alkaline electrochemical cell.

In an aspect, the present disclosure describes a system comprising: (1) one or more alkaline electrochemical cells comprising $Ag_2O$—Zn; (ii) a source configured to provide a varying voltage potential to the one or more alkaline electrochemical cells; (iii) a detector configured to measure an output current response of the one or more alkaline electrochemical cells, the output current response comprising a phase response as a function of frequency; and (iv) an analyzer configured to determine a depth of discharge of the one or more alkaline electrochemical cells based on a linear relationship of the depth of discharge with the phase response.

The detector may be configured to measure the phase response of the one or more alkaline electrochemical cells using impedance spectroscopy.

The analyzer may be further configured to determine whether the depth of discharge is less than or equal to a predetermined threshold.

In an aspect, the present disclosure described a method comprising: (i) providing one or more alkaline electrochemical cells comprising $Ag_2O$—Zn; (ii) applying a one or more current pulses to the one or more alkaline electrochemical cells; (iii) measuring one or more resistance values of the one or more alkaline electrochemical cells during the one or more constant-current pulses; and (iv) determining whether a depth of discharge of the one or more alkaline electrochemical cells is less than or equal to a predetermined threshold based on the one or more resistance values.

The method may further comprise measuring a voltage of the one or more alkaline electrochemical cells at least before and during application of the one or more current pulses. Measuring the one or more resistance values may comprise calculating the one or more resistance values based on the measured voltage.

The one or more current pulses may be in a range of about 0.5 mA to about 8 mA.

The method may further comprise determining whether the depth of discharge is less than or equal to a predetermined threshold. If it is determined that the depth of discharge is less than or equal to the predetermined threshold, the one or more electrochemical cells may be determined to be defective. The predetermined threshold may be 50%.

The method may further comprise determining whether the one or more electrochemical cells have enough power for a predetermined application based on the depth of discharge.

In an aspect the present disclosure describes a system comprising: (i) one or more alkaline electrochemical cells comprising $Ag_2O$—Zn; (ii) a source configured to apply a one or more current pulses to the one or more alkaline electrochemical cells; (iii) a detector configured to measure one or more resistance values of the one or more alkaline electrochemical cells during the one or more current pulses; and (iv) an analyzer configured to determine whether a depth of discharge of the one or more alkaline electrochemical cells is greater than a predetermined threshold based on the one or more resistance values.

Advantages and additional features of the subject matter of the present disclosure will be set forth in the detailed description which follows, and in part will be readily apparent to those skilled in the art from that description or recognized by practicing the subject matter of the present disclosure as described herein, including the detailed description which follows, the claims, as well as the appended drawings.

It is to be understood that both the foregoing general description and the following detailed description present embodiments of the subject matter of the present disclosure and are intended to provide an overview or framework for understanding the nature and character of the subject matter of the present disclosure as it is claimed. The accompanying drawings are included to provide a further understanding of the subject matter of the present disclosure and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative and are not intended to limit the scope of the claims in any manner.

BRIEF DESCRIPTION OF THE DRAWINGS

The following detailed description of specific embodiments of the present disclosure can be best understood when read in conjunction with the following drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
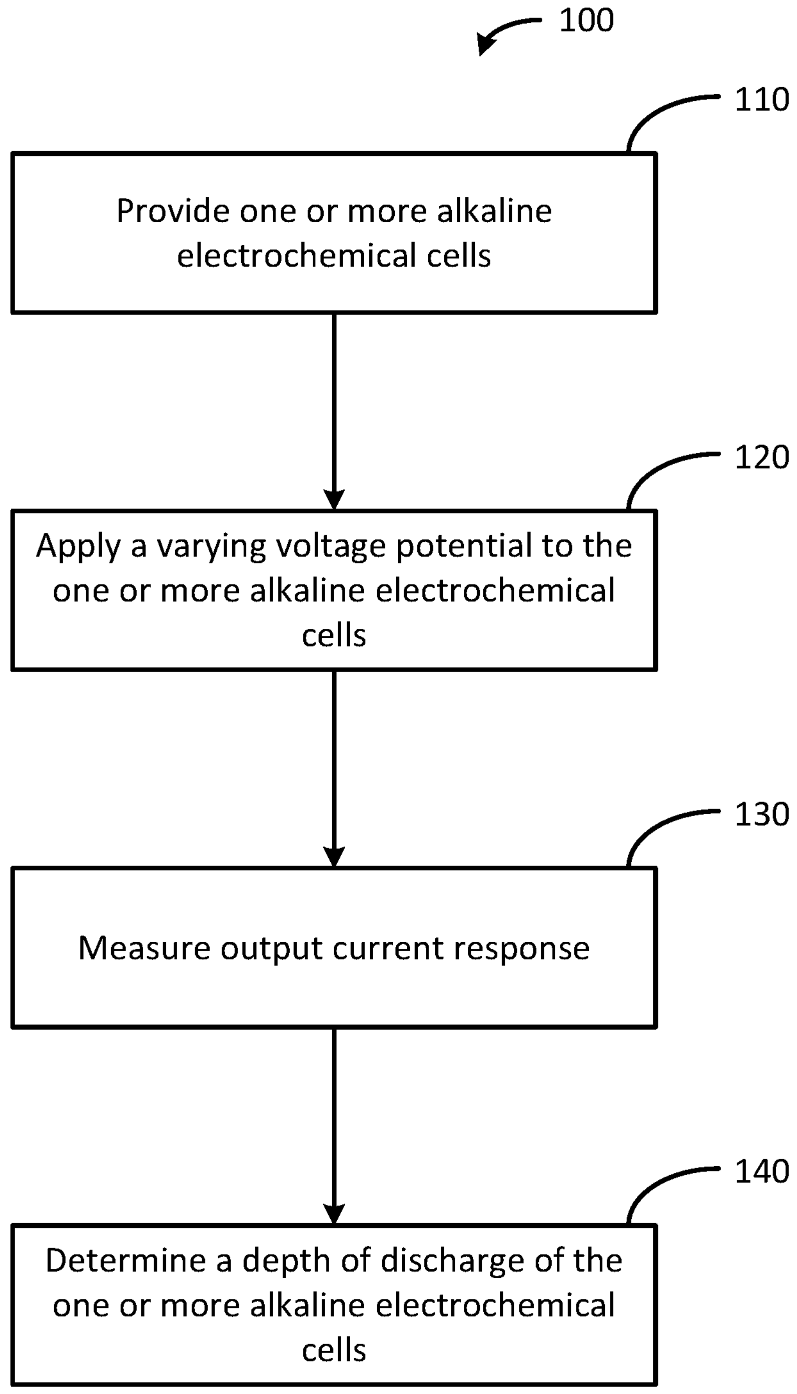
FIGS. 1A and 1B illustrate processes for determining the depth of discharge of a battery based on a phase response in accordance with embodiments described herein.

Reference will now be made in greater detail to various embodiments of the subject matter of the present disclosure, some embodiments of which are illustrated in the accompanying drawings. Like numbers used in the figures refer to like components and steps. However, it will be understood that the use of a number to refer to a component in a given figure is not intended to limit the component in another figure labeled with the same number. In addition, the use of different numbers to refer to components in different figures is not intended to indicate that the different numbered components cannot be the same or similar to other numbered components.

The determination of the amount of energy remaining may be used to determine reliability and future use of batteries. During use of a battery, the battery is discharged. The depth of discharge refers to the percent of the battery's energy (or capacity) that has been used; State of charge (SoC) refers to the percent of the battery's energy (or capacity) that has not been used. Alkaline batteries, such as alkaline silver-oxide ($Ag_2O$—Zn) batteries can be difficult to determine the percent of energy used as the cells may have similar electrical signals at many states of charge. The systems and methods described herein may allow screening of batteries before usage, assembly, and/or implant. Accordingly, systems and methods described herein may decrease the risk of a faulty or depleted battery being implanted in a patient. Additionally, such systems and methods may reduce scrap by screening out faulty batteries before use in production and/or device builds.

The methods described herein can be implemented for batteries for many different applications. According to some configurations, the batteries described herein are configured to be used in implantable medical devices. For example, the implantable medical devices may include pacemakers.

One possible way to determine the depth of discharge of an alkaline battery is by using impedance spectroscopy. Impedance spectroscopy employs alternating current and evaluates the electrical response as a function of frequency. Implementation of impedance spectroscopy on silver-oxide batteries shows a correspondence of the depth of discharge with the phase response at certain frequencies used. This correspondence can be used to determine the depth of discharge.

According to various embodiments the non-destructive impedance spectroscopy can be used on a coin cell. Impedance spectroscopy returns a phase value as a function of frequency. According to embodiments described herein, the phase angle measured through alternating current impedance spectroscopy responds approximately linearly as a function of depth of discharge. The approximately linear response may allow determination of a cell depth of discharge before use to determine the batteries health and fitness for use. Impedance spectroscopy provides a non-destructive test that can be performed in seconds. Impedance spectroscopy can be performed as part of a manufacturing process to ensure that the battery will have enough energy for use and is functioning properly based on the determined depth of discharge. The correlation between depth of discharge and the phase response of impedance spectroscopy can also be used to assess self-discharge of the silver-oxide battery. For example, by measuring the phase angle of the battery, and determining the corresponding depth of discharge, the amount of capacity depleted since the time of manufacture of the cell can be determined to estimate the self-discharge rate, which can be defined as the fraction of the original cell capacity lost over a calendar period, e.g., years or days.

The specific correlation or linear relationship between depth of discharge and the phase response of impedance spectroscopy may depend on one or more parameters of the silver-oxide battery. Such parameters may include, for example, a manufacturing processes, a battery size, one or more additives, battery chemistry, or other battery parameters that can vary. For example, an initial phase angle at a low depth of discharge (e.g., 0% depth of discharge to 5% depth of discharge) of a first silver-oxide battery from one manufacturer may be greater than an initial phase angle of a second silver-oxide battery from another manufacturer. The first silver-oxide battery may, for example, include an additive that differs from the second silver-oxide battery. Accordingly, to determine a depth of discharge, the linear relationship of depth of discharge may be determined based on a predetermined initial phase response or a predetermined phase response model. An initial phase response or a phase response model may be predetermined based on any suitable parameter of silver-oxide batteries. For example, an initial phase response or a phase response model may be determined for each manufacturer, for each additive (or combinations of additives), for each size, or other parameter of silver-oxide batteries. Accordingly, each predetermined initial phase response or predetermined phase response model may correspond to a parameter of silver-oxide batteries. Thus, the linear relationship of the depth of discharge may be determined based on one or more parameters of a silver-oxide battery and the corresponding predetermined initial phase response or predetermined phase response model.

The invention is defined in the claims. However, below there is provided a non-exhaustive list of non-limiting examples. Any one or more of the features of these examples may be combined with any one or more features of another example, embodiment, or aspect described herein.

Example Ex1: A method, comprising: providing one or more alkaline electrochemical cells comprising $Ag_2O$—Zn; applying a varying voltage potential to the one or more alkaline electrochemical cells; measuring an output current response of the one or more alkaline electrochemical cells, the output current response comprising a phase response as a function of frequency; and determining a depth of discharge of the one or more alkaline electrochemical cells based on a linear relationship of the depth of discharge with the phase response.

Example Ex2: The method as in example Ex1, wherein measuring the output current response of the one or more alkaline electrochemical cells comprises measuring the phase response of the one or more alkaline electrochemical cells using impedance spectroscopy.

Example Ex3: The method as in any one of the previous examples, further comprising determining whether the depth of discharge is less than or equal to a predetermined threshold.

Example Ex4: The method as in example Ex3, wherein if it is determined that the depth of discharge is not less than or equal to the predetermined threshold, determining that the one or more alkaline electrochemical cells are defective.

Example Ex5: The method as in any one of examples Ex3 or Ex4, wherein the predetermined threshold is 50%.

Example Ex6: The method as in any one of the previous examples, further comprising determining whether the one or more alkaline electrochemical cells have enough power for a predetermined application based on the depth of discharge.

Example Ex7: The method as in any one of the previous examples, wherein a phase angle decreases as a function of depth of discharge at frequencies in a predetermined range.

Example Ex8: The method as in example Ex7, wherein the predetermined range is about 0.001 Hz to about 10 Hz.

Example Ex9: The method as in any one of the previous examples, further comprising determining the linear relationship based on one or more parameters of the alkaline electrochemical cell.

Example Ex10: A system, comprising: one or more alkaline electrochemical cells comprising $Ag_2O$—Zn; a supply configured to provide a varying voltage potential to the one or more alkaline electrochemical cells; a detector configured to measure an output current response of the one or more alkaline electrochemical cells, the output current response comprising a phase response as a function of frequency; and an analyzer configured to determine a depth of discharge of the one or more alkaline electrochemical cells based on a linear relationship of the depth of discharge with the phase response.

Example Ex11: The system as in example Ex10, wherein the detector is configured to measure the phase response of the one or more alkaline electrochemical cells using impedance spectroscopy.

Example Ex12: The system as in any one of examples Ex10 or Ex11, wherein the analyzer is further configured to determine whether the depth of discharge is less than or equal to a predetermined threshold.

Example Ex13: A method, comprising: providing one or more alkaline electrochemical cells comprising $Ag_2O$—Zn; applying a one or more current pulses to the one or more alkaline electrochemical cells; measuring one or more resistance values of the one or more alkaline electrochemical cells during the one or more current pulses; and determining whether a depth of discharge of the one or more alkaline electrochemical cells is less than or equal to a predetermined threshold based on the one or more resistance values.

Example Ex14: The method as in example Ex13, further comprising measuring a voltage of the one or more alkaline electrochemical cells at least before and during application of the one or more current pulses.

Example Ex15: The method as in example Ex14, wherein measuring the one or more resistance values comprises calculating the one or more resistance values based on the measured voltage.

Example Ex16: The method as in any one of examples Ex13 to Ex15, wherein the one or more current pulses are in a range of about 0.5 mA to about 8 mA.

Example Ex17: The method as in any one of examples Ex13 to Ex16, wherein if it is determined that the depth of discharge is less than or equal to the predetermined threshold, determining that the one or more alkaline electrochemical cells are defective.

Example Ex18: The method as in any one of examples Ex13 to Ex17, wherein the predetermined threshold is 50%.

Example Ex19: The method as in any one of examples Ex13 to Ex18, further comprising determining whether the one or more alkaline electrochemical cells have enough power for a predetermined application based on the depth of discharge.

Example Ex20: A system, comprising: one or more alkaline electrochemical cells comprising $Ag_2O$—Zn; a supply configured to apply a one or more current pulses to the one or more alkaline electrochemical cells; a detector configured to measure one or more resistance values of the one or more alkaline electrochemical cells during the one or more current pulses; and an analyzer configured to determine whether a depth of discharge of the one or more alkaline electrochemical cells is greater than a predetermined threshold based on the one or more resistance values.

FIG. 1A illustrates a process 100 for determining the depth of discharge of a battery based on a phase response in accordance with embodiments described herein. One or more alkaline electrochemical cells are provided 110.

According to various embodiments, the alkaline electrochemical cells comprise $Ag_2O$—Zn. A varying voltage potential is applied 120 to the one or more electrochemical cells. The varying voltage potential may be a sinusoidal voltage at one or more frequencies. The one or more frequencies may be in a range of about 0.1 Hz to about 2 Hz.

An output current response of the one or more alkaline electrochemical cells is measured 130. According to various embodiments, the output current response includes a phase response as a function of frequency. The output current response may be measured by measuring the phase response of the one or more alkaline electrochemical cells using impedance spectroscopy.

A depth of discharge of the one or more alkaline electrochemical cells is determined 140. The depth of discharge may be based on a linear relationship of the depth of discharge with the phase response. According to various embodiments, a phase angle decreases as a function of depth of discharge at frequencies in a predetermined range. The linear relationship may be based on a one or more parameters of the alkaline electrochemical cell. For example, the one or more parameters may correspond to one of a plurality of predetermined initial phase responses that can be used to provide an offset to the linear relationship. Further, for example, the one or more parameters may correspond to one of a plurality of predetermined phase response models that can be used to define the linear relationship. The predetermined range may be about 0.001 Hz to about 10 Hz. Further, the predetermined range may be about 0.01 Hz to about 5 Hz. Still further, the predetermined range may be about 0.1 Hz to about 2 Hz.

Figure 1B:
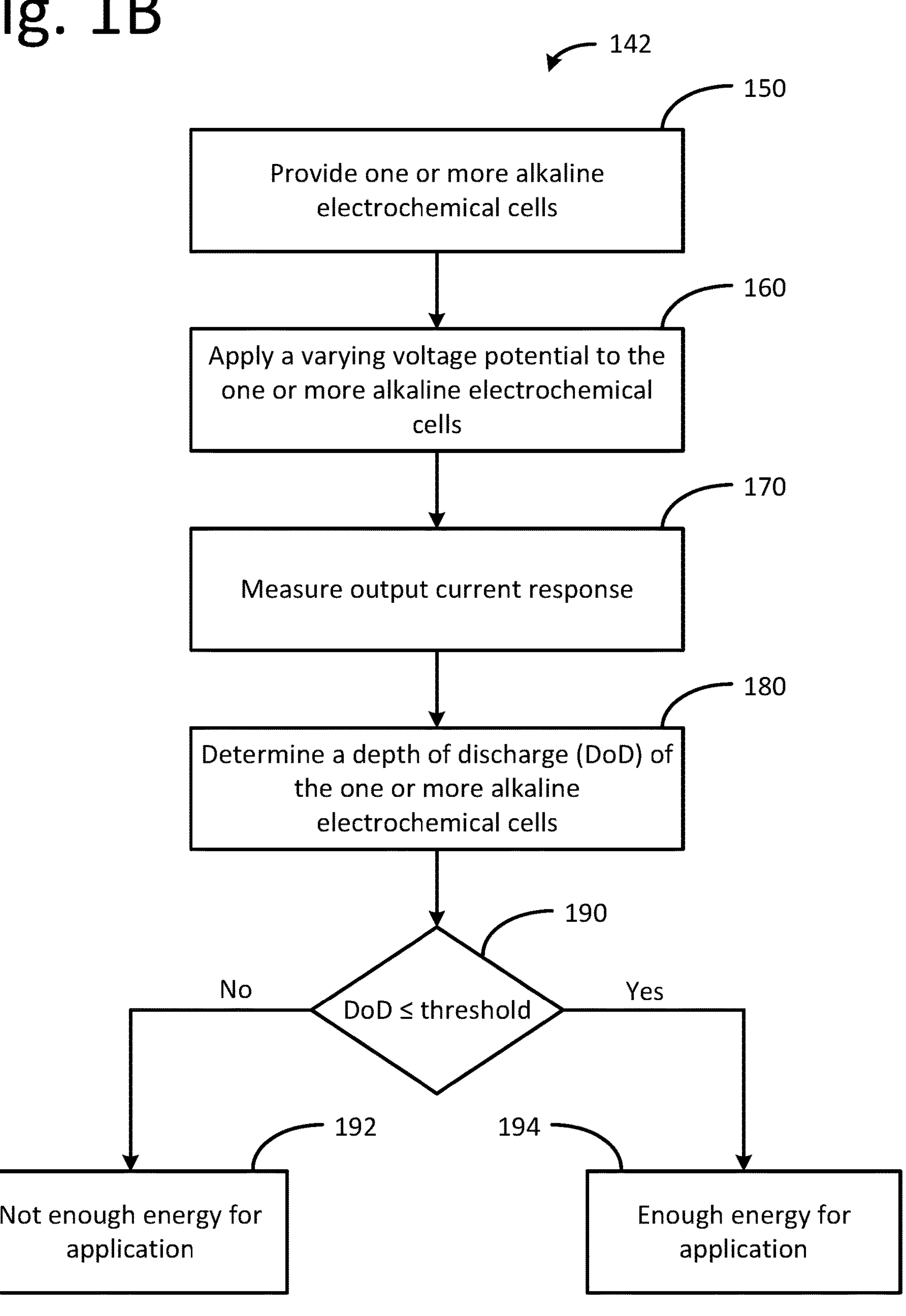

FIG. 1B illustrates a process 142 for determining whether the depth of discharge of the one or more electrochemical cells are suitable for a predetermined application in accordance with embodiments described herein. One or more alkaline electrochemical cells are provided 150. A varying voltage potential is applied 160 to the one or more electrochemical cells. An output current response of the one or more alkaline electrochemical cells is measured 170. A depth of discharge of the one or more alkaline electrochemical cells are determined 180. The depth of discharge may be based on a linear relationship of the depth of discharge with the phase response.

The linear relationship may be based on a one or more parameters of the alkaline electrochemical cell. For example, the one or more parameters may correspond to one of a plurality of predetermined initial phase responses that can be used to provide an offset to the linear relationship. Further, for example, the one or more parameters may correspond to one of a plurality of predetermined phase response models that can be used to define the linear relationship.

It is determined 190 whether the depth of discharge is less than or equal to a predetermined threshold. The predetermined threshold may be based on an amount of energy needed for a particular application. In some cases, the predetermined threshold is based on a generic predetermined threshold. The predetermined threshold may be in a range from about 0% to about 50%, such as from about 0% to about 30%.

If it is determined 190 that the depth of discharge is less than or equal to the predetermined threshold, it may be determined 194 that the electrochemical cells do have enough energy for the particular application. In some cases, if it is determined that the depth of discharge is not less than or equal to the predetermined threshold, it may be determined that the electrochemical cells are defective. If it is determined 190 that the depth of discharge is not less than or equal to the predetermined threshold, it is determined 192 that the electrochemical cells do not have enough energy for the particular application.

Figure 2:
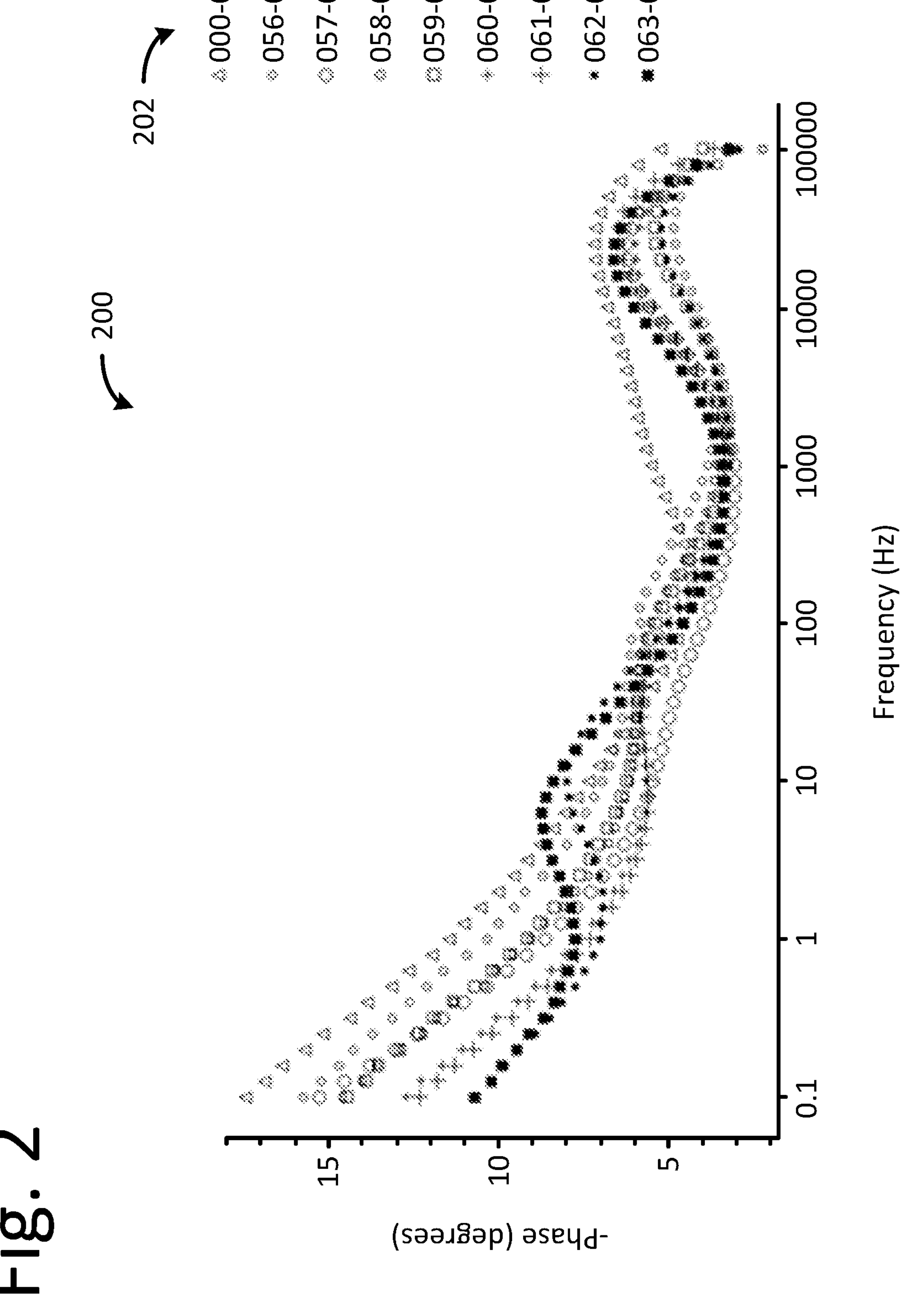
FIG. 2 shows phase angle as a function of frequency for silver-oxide coin cells as a function of depth of discharge in accordance with embodiments described herein.

FIG. 2 shows a graph 200 of one example of impedance spectroscopy for silver-oxide coin cells as a function of depth of discharge in accordance with embodiments described herein. As shown, the graph includes an x-axis that depicts a frequency of the applied voltage, a y-axis that depicts a resulting phase angle (e.g., phase response), symbols that each correspond to a depth of discharge of an electrochemical cell, and a legend 202. Additionally, a cell number is represented by the first three numbers listed next to each symbol and the depth of discharge as a percentage is represented by the last three numbers listed next to the symbols in the legend 202. For example, the number next to the large solid square in the legend 202 is 063-050 and corresponds to a cell number of 063 and a depth of discharge of 50%. As shown in graph 200, at low frequencies (~0.1 to ~2 Hz), the phase angle (e.g., phase response) decreases as a function of the depth of discharge. Accordingly, such low frequencies (~0.1 to ~2 Hz) can be used to determine a depth of discharge based on the resulting phase angle or response.

Figure 3:
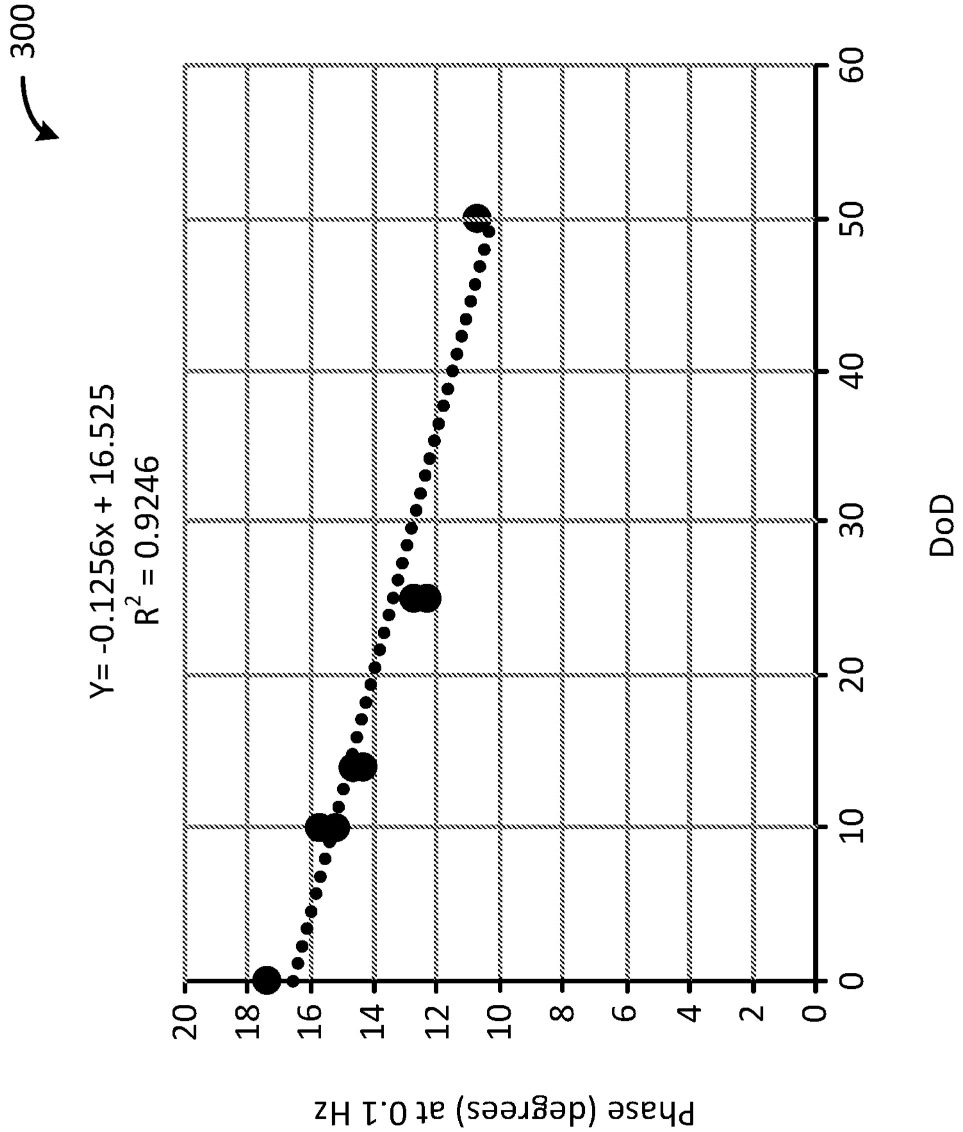
FIG. 3 illustrates a linear relationship of the phase in degrees with the depth of discharge at 0.1 Hz in accordance with embodiments described herein.

FIG. 3 shows a graph 300 that illustrates a linear relationship of a phase response in degrees with a depth of discharge at 0.1 Hz in accordance with embodiments described herein. The x-axis of the graph 300 depicts the depth of discharge as a percentage and the y-axis of the graph 300 depicts the phase response in degrees. Linear relationships such as the linear relationship depicted in graph 300 can be used to determine the depth of discharge based on the determined phase.

Figure 4A:
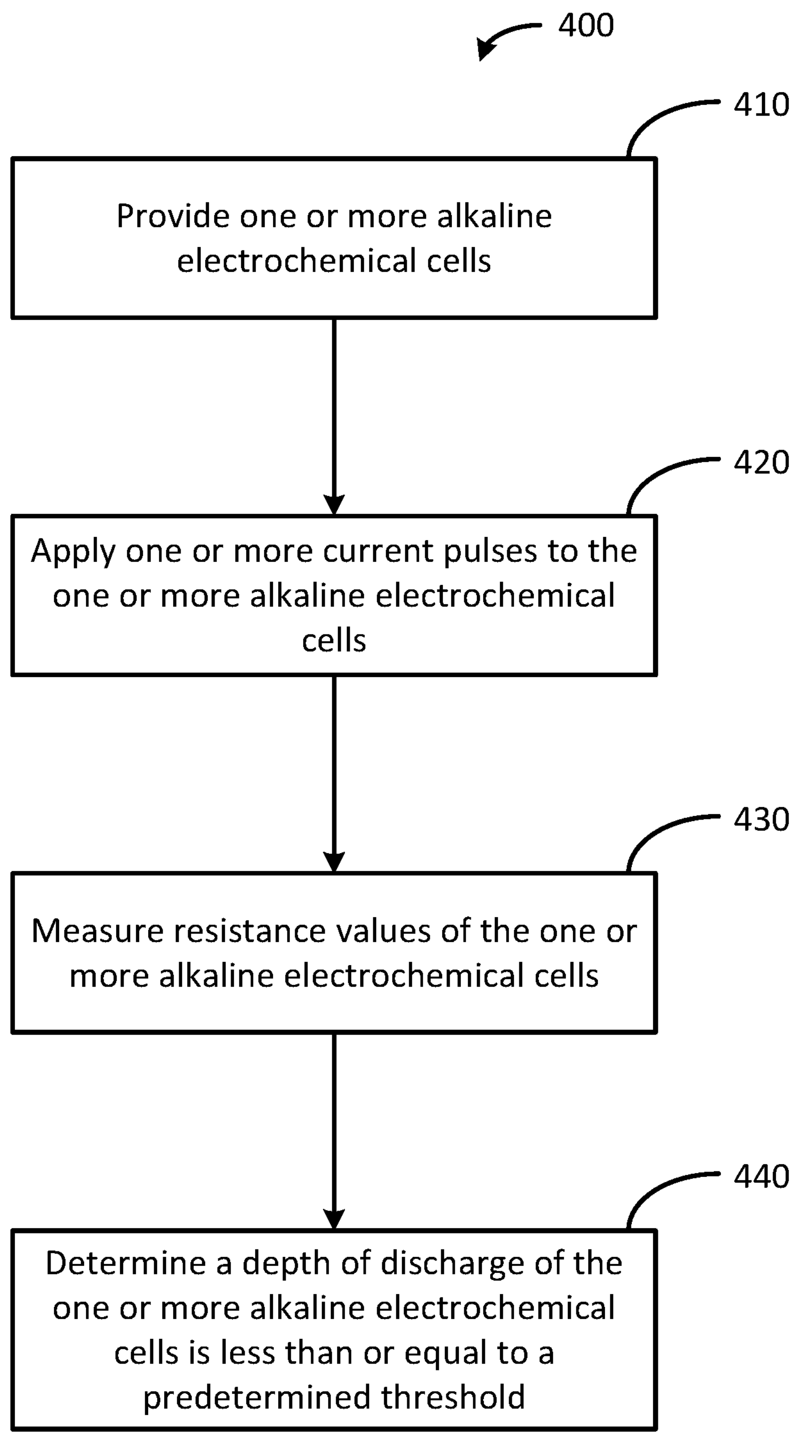
FIGS. 4A and 4B show processes for determining the depth of discharge of electrochemical cells using DC energy in accordance with embodiments described herein.

In some embodiments, the amount of energy remaining in a battery or the depth of discharge of the battery may be determined using direct current (DC) energy. FIG. 4A shows a process or method 400 for determining the depth of discharge of electrochemical cells using DC energy in accordance with embodiments described herein. One or more alkaline electrochemical cells are provided 410. In some cases, the alkaline cells comprise $Ag_2O$—Zn One or more current pulses are applied 420 to the one or more alkaline electrochemical cells. The one or more current pulses may be in a range of about 0.5 mA to about 8 mA. Additionally, the one or more current pulses may have a pulse duration in a range of about 1 second to about 10 seconds. In one or more embodiments, the one or more current pulses may have a pulse duration of about five seconds. One or more current pulses may be applied to each of the one or more alkaline electrochemical cells. Accordingly, current pulses applied to each of the one or more alkaline electrochemical cells may be in a range of about 0.5 mA to about 8 mA. For example, a plurality of electrochemical cells may be arranged in parallel and one or more current pulses may be applied such that a current pulse in a range of about 0.5 mA to about 8 mA is applied to each of the plurality of electrochemical cells. Additionally, each of the one or more current pulses may be applied with a pulse duration in a range of about 1 second to about 10 seconds.

One or more resistance values of the one or more alkaline electrochemical cells are measured 430 during the one or more current pulses. According to various embodiments, a voltage potential of the one or more electrochemical cells are measured at least one of before and after the one or more current pulses are applied. In some cases, measuring 430 the one or more resistance values comprises measuring the one or more resistance values based on the measured voltage.

A depth of discharge of the one or more alkaline electrochemical cells is determined 440 to be less than or equal to a predetermined threshold based on the one or more resistance values.

Similar to the linear relationship between depth of discharge and the phase response of impedance spectroscopy, the relationship between the resistance values and the depth of discharge may depend on one or more parameters of the alkaline electrochemical cell. Such parameters may include, for example, a manufacturing processes, a battery or electrochemical cell size, one or more additives, battery or electrochemical cell chemistry, or other battery or electrochemical cell parameters that can vary. Accordingly, the determining the one or more electrochemical cells is less than or equal to the predetermined threshold may be based on one or more parameters of the one or more alkaline electrochemical cells.

Figure 4B:
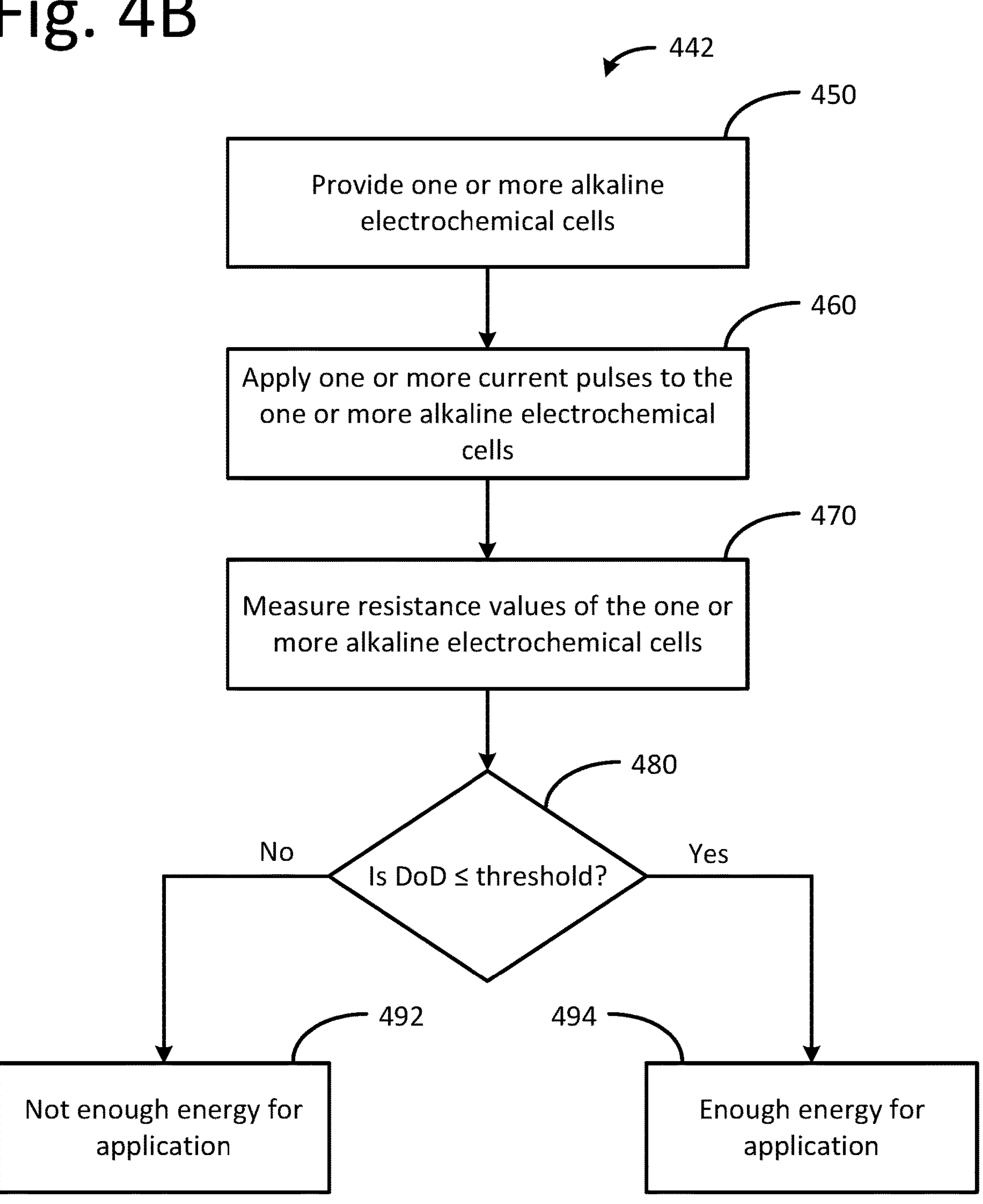

FIG. 4B illustrates a process or method 442 for determining whether the depth of discharge of the one or more electrochemical cells are suitable for a predetermined application in accordance with embodiments described herein. One or more alkaline electrochemical cells are provided 450. One or more current pulses are applied 460 to the one or more alkaline electrochemical cells. One or more resistance values of the one or more alkaline electrochemical cells are measured 470 during the one or more current pulses.

It is determined 480 whether the depth of discharge is less than or equal to a predetermined threshold based on the one or more resistance values. Determining whether the depth of discharge is less than or equal to the predetermined threshold may also be based on a one or more parameters of the one or more alkaline electrochemical cells. The predetermined threshold may be based on an amount of energy needed for a particular application. In some cases, the predetermined threshold is based on a generic predetermined threshold. The predetermined threshold may be from about 0% to about 50% depth of discharge. In one embodiment, the predetermined threshold may be from about 0% to about 30% depth of discharge.

If it is determined 480 that the depth of discharge is less than or equal to the predetermined threshold, it may be determined 494 that the electrochemical cells do have enough energy for the particular application. In some cases, if it is determined that the depth of discharge is less than or equal to the predetermined threshold, it may be determined that the electrochemical cells are not defective. If it is determined 490 that the depth of discharge is not less than or equal to the predetermined threshold, it is determined 492 that the electrochemical cells do not have enough energy for the particular application.

Figure 5A:
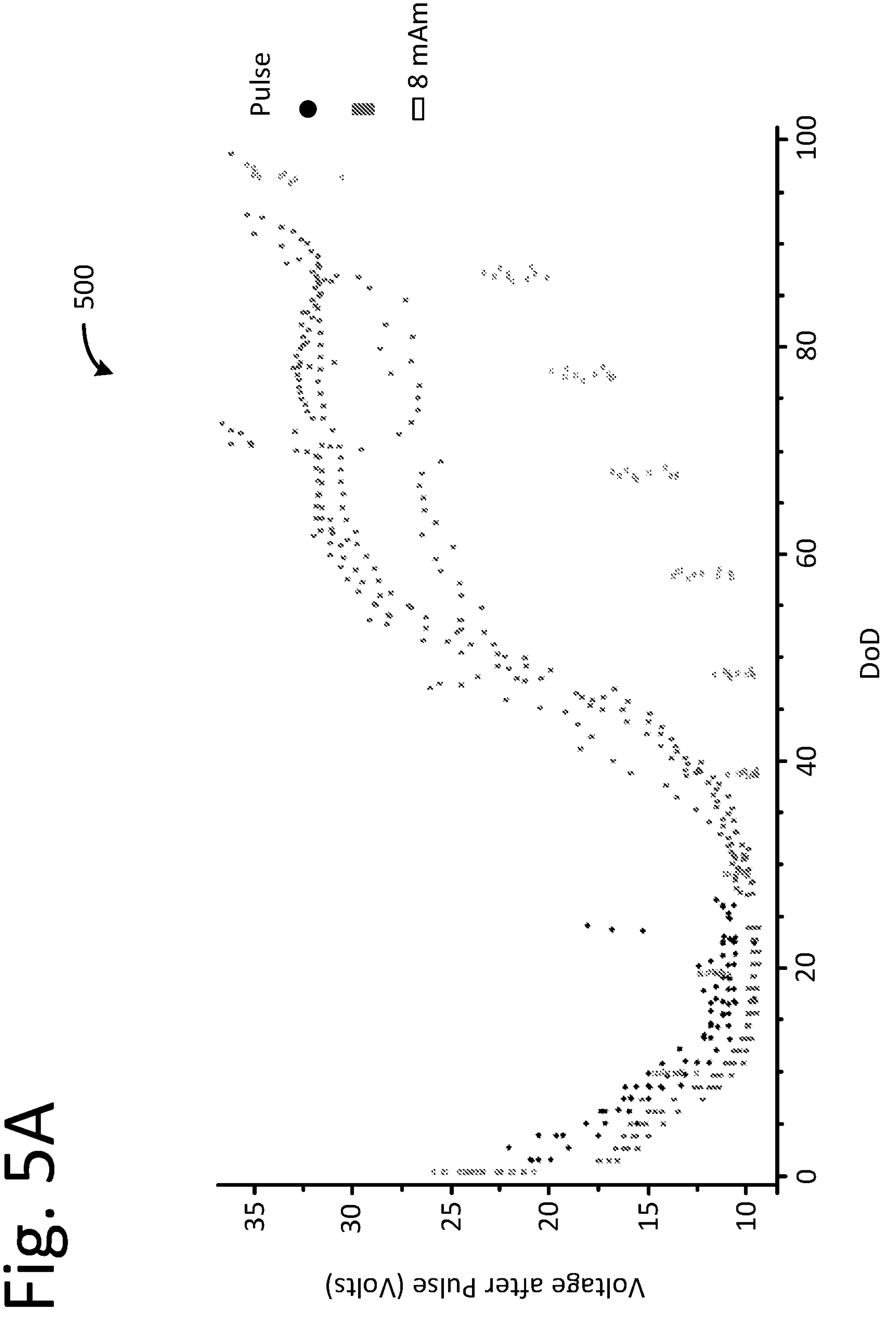
FIGS. 5A and 5B illustrate an example where different currents were intermittently applied to the batteries while the batteries are being discharged in accordance with embodiments described herein.
Figure 5B:
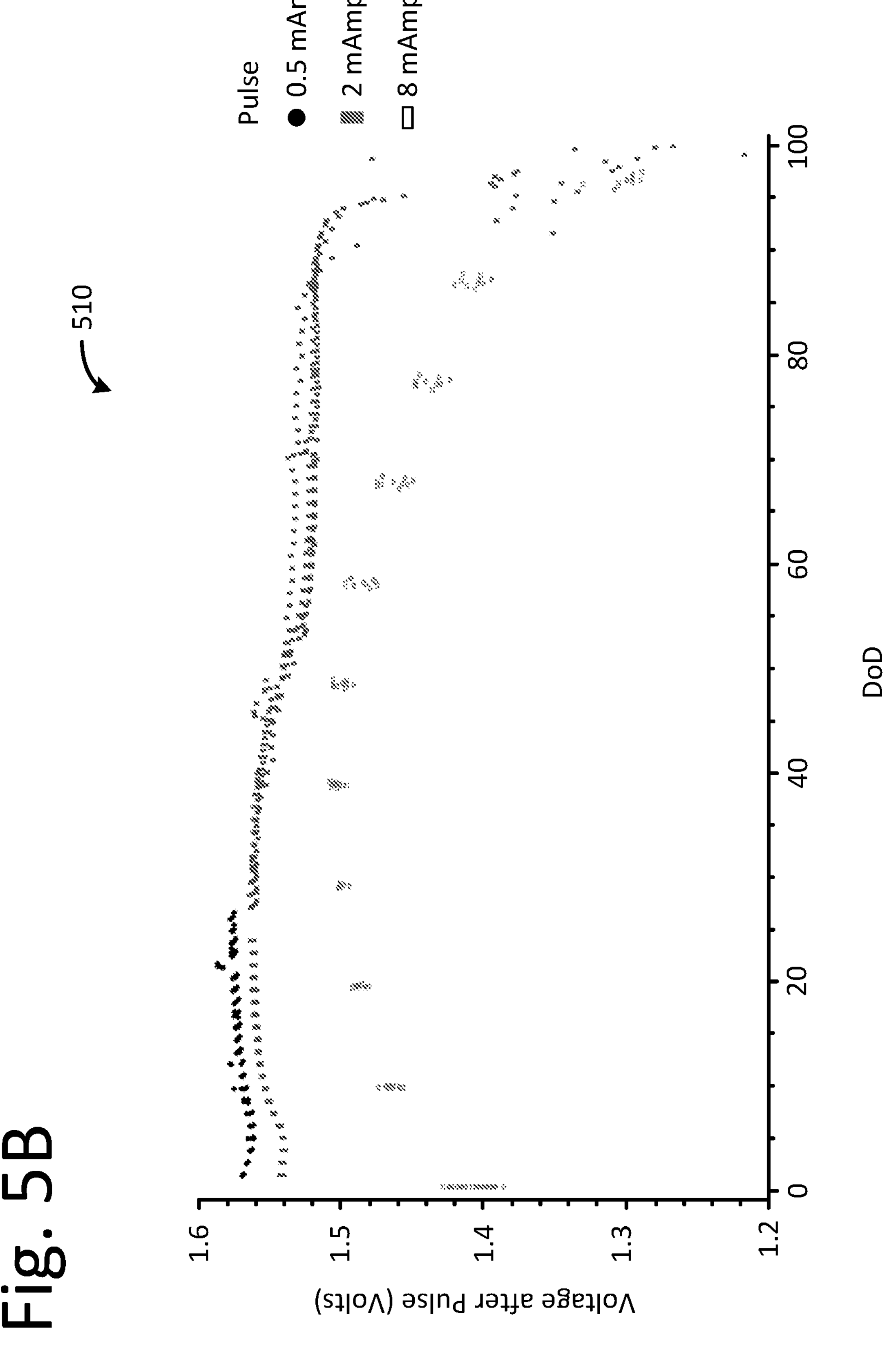

FIGS. 5A and 5B illustrate an example of various currents intermittently applied to the silver-oxide batteries while such batteries are discharged at about 30 μA. FIG. 5A shows a graph 500 that depicts a measured resistance of the silver-oxide batteries as a function of depth of discharge. The graph 500 depicts the depth of discharge as a percentage on the x-axis and the measured resistance in ohms on the y-axis. FIG. 5B shows a graph 510 that depicts the measured voltage during the application of a current pulse as a function of depth of discharge. The graph 510 depicts the depth of discharge as a percentage on the x-axis and the measured voltage in Volts on the y-axis. Current pulses of 0.5 mA (black filled circle), 2 mA (grey filled vertical rectangle), and 8 mA (horizontal rectangle outline) were applied to groups of batteries for approximately 5 seconds at various intervals. Accordingly, each of the graphs 500, 510 depict the range of measured resistance or measured voltage at each interval for each group data points represented by their corresponding symbol. In this example, the currents were applied at a constant temperature of about 37 degrees Celsius. The results as depicted in graphs 500, 510 show that the 2 mA current pulses can be used to identify if a cell has lost 50% or more of its original energy.

To determine a measured resistance of a given silver-oxide battery or alkaline electrochemical cell, a first voltage of the battery may be measured without application of a current pulse and a second voltage of the battery may be measured while a current pulse (e.g., 2 mA) is applied. A measured resistance value can be calculated by dividing the difference in first voltage and the second voltage by the value of the current pulse (e.g., 2 mA). Accordingly, the voltage measured during applied current pulses can provide the criteria or can be extrapolated to a "resistance" value to allow comparison to other techniques.

A trend can be observed in the graphs 500, 510 of FIGS. 5A and 5B that shows that the measured resistance was greater than 20 Ohms when the cells had been discharged at or more than 50%. Such resistance could be used as a diagnostic to determine if a coin cell has sufficient power for an application. Additionally, a measured voltage of the cells may be less than about 1.545 Volts after application of a 2 mA pulse when the cells have been discharged at or more than 50%. Although the example shown in graphs 500, 510 of FIGS. 5A and 5B depict an example of silver-oxide batteries from a single manufacturer resulting in a threshold of 20 Ohms and/or 1.545 Volts, similar processes or methods can be used to determine a threshold based on any suitable parameter or parameters of silver-oxide batteries. Such parameters may include, for example, a manufacturing process, a battery size, one or more additives, or other battery parameters of silver-oxide batteries that can vary.

The approach illustrated in graphs 500, 510 of FIGS. 5A and 5B may be used alone or in combination with other techniques to determine the depth of discharge. Combining this current pulse approach with other tests such as, for example, measurements of one or more of measuring open circuit voltage, measuring voltage after multiple pulses at different rates, measuring voltages after pulses at different durations, and/or using constant-voltage pulsing may allow for greater testing of the energy remaining in a battery.

Figure 6:
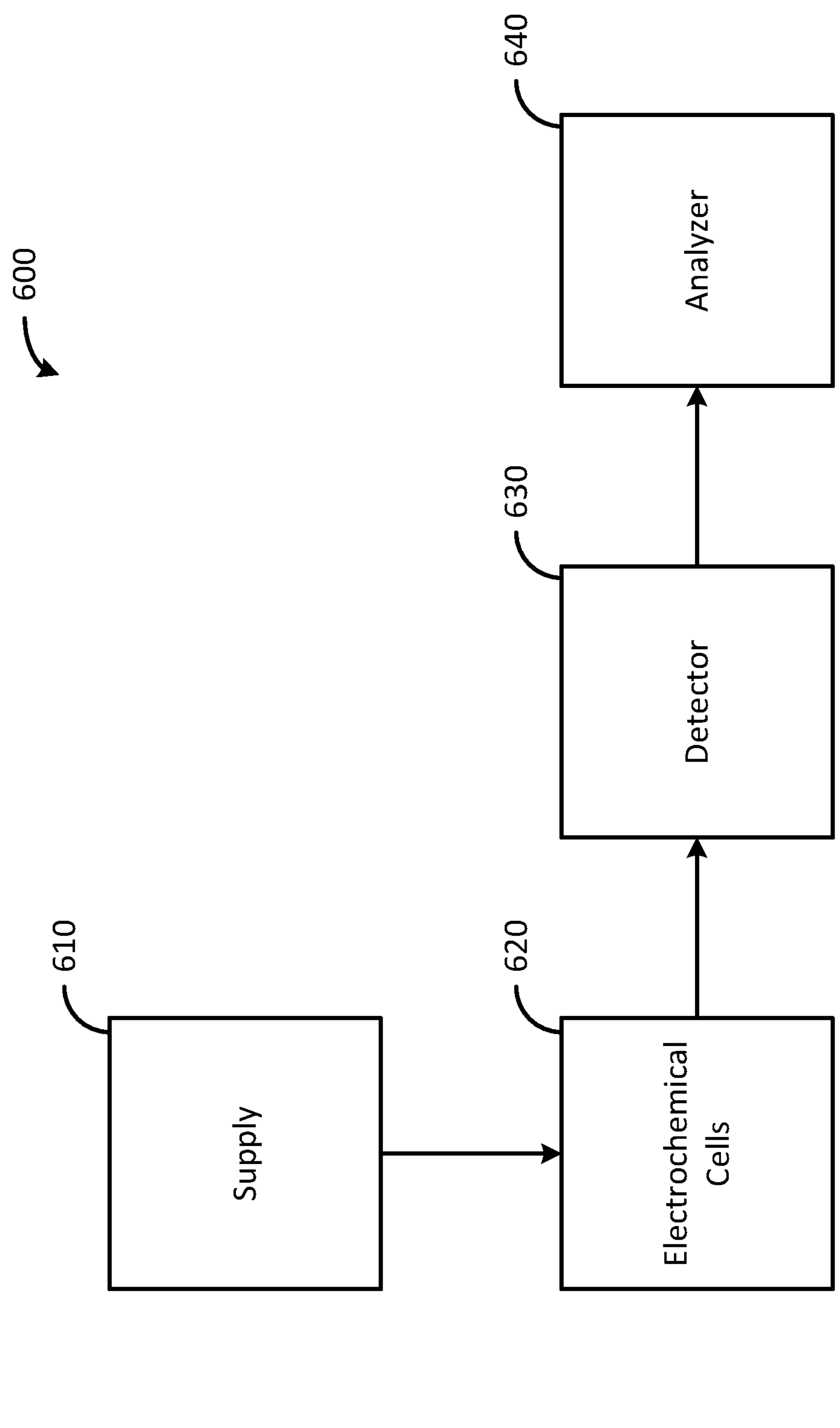
FIG. 6 illustrates a system that is capable of performing the processes described herein.

FIG. 6 illustrates a system 600 that is capable of performing the processes (e.g., processes or methods 100, 142, 400, 442) described herein. The system 600 includes a supply 610 that may be configured to supply one or more of a varying voltage potential and one or more current pulses to an electrochemical cell 620. The system 600 further includes a detector 630 that may be used to measure one or more of an output current response and one or more resistance values of the electrochemical cell. Still further, the system 600 includes an analyzer 640 that may be configured to determine a depth of discharge of the electrochemical cell based on one or more of an output current response of a impedance spectroscopy or one or more resistance values determined using DC energy (e.g., current pulses).

All scientific and technical terms used herein have meanings commonly used in the art unless otherwise specified. The definitions provided herein are to facilitate understanding of certain terms used frequently herein and are not meant to limit the scope of the present disclosure.

As used herein, singular forms "a," "an" and "the" include plural referents unless the context clearly dictates otherwise. As used in this specification and the appended claims, the term "or" is generally employed in its sense including "and/or" unless the content clearly dictates otherwise. The term "and/or" means one or all of the listed elements or a combination of any two or more of the listed elements.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the inventive technology.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be apparent to those skilled in the art that various modifications and variations can be made to the present inventive technology without departing from the spirit and scope of the disclosure. Since modifications, combinations, sub-combinations and variations of the disclosed embodiments incorporating the spirit and substance of the inventive technology may occur to persons skilled in the art, the inventive technology should be construed to include everything within the scope of the appended claims and their equivalents.

What is claimed is:

1. A method, comprising:

providing one or more alkaline electrochemical cells comprising $Ag_2O$—Zn;

applying a varying voltage potential to the one or more alkaline electrochemical cells at a single frequency;

measuring an output current response of the one or more alkaline electrochemical cells, the output current response comprising a phase response as a function of the single frequency;

determining a linear relationship of a depth of discharge of the one or more alkaline electrochemical cells and the phase response as a function of the single frequency, the linear relationship based on one or more parameters of the alkaline electrochemical cell, the one or more parameters corresponding to one of a plurality of initial phase responses; and determining the depth of discharge of the one or more alkaline electrochemical cells based on the linear relationship.

2. The method as in claim 1, wherein measuring the output current response of the one or more alkaline electrochemical cells comprises measuring the phase response of the one or more alkaline electrochemical cells using impedance spectroscopy.

3. The method as in claim 1, further comprising determining whether the depth of discharge is less than or equal to a predetermined threshold.

4. The method as in claim 3, wherein if it is determined that the depth of discharge is not less than or equal to the predetermined threshold, determining that the one or more alkaline electrochemical cells are defective.

5. The method as in claim 3, wherein the predetermined threshold is 50%.

6. The method as in claim 1, further comprising determining whether the one or more alkaline electrochemical cells have enough power for a predetermined application based on the depth of discharge.

7. The method as in claim 1, wherein a phase angle decreases as a function of depth of discharge at frequencies in a predetermined range.

8. The method as in claim 7, wherein the predetermined range is about 0.001 Hz to about 10 Hz.

9. A system, comprising:

one or more alkaline electrochemical cells comprising $Ag_2O$—Zn;

a supply configured to provide a varying voltage potential to the one or more alkaline electrochemical cells at a single frequency;

a detector configured to measure an output current response of the one or more alkaline electrochemical cells, the output current response comprising a phase response as a function of the single frequency; and an analyzer configured to:

determine a linear relationship of a depth of discharge of the one or more alkaline electrochemical cells and the phase response as a function of the single frequency, the linear relationship based on one or more parameters of the alkaline electrochemical cell, the one or more parameters corresponding to one of a plurality of initial phase responses; and determine the depth of discharge of the one or more alkaline electrochemical cells based on the linear relationship.

10. The system as in claim 9, wherein the detector is configured to measure the phase response of the one or more alkaline electrochemical cells using impedance spectroscopy.

11. The system as in claim 9, wherein the analyzer is further configured to determine whether the depth of discharge is less than or equal to a predetermined threshold.

12. The system of claim 9, wherein the analyzer is configured to provide an offset to the linear relationship based on the one or more parameters.

13. A system, comprising:

one or more alkaline electrochemical cells comprising $Ag_2O$—Zn;

a supply configured to provide a varying voltage potential to the one or more alkaline electrochemical cells at a single frequency;

a detector configured to measure an output current response of the one or more alkaline electrochemical cells, the output current response comprising a phase response as a function of the single frequency; and an analyzer configured to:

determine a linear relationship of a depth of discharge of the one or more alkaline electrochemical cells and the phase response as a function of the single frequency, the linear relationship based on one or more parameters of the alkaline electrochemical cell;

determine the depth of discharge of the one or more alkaline electrochemical cells based on the linear relationship; and provide an offset to the linear relationship based on the one or more parameters.

* * * * *